US012622292B2

(12) United States Patent
Chen et al.

(10) Patent No.: US 12,622,292 B2
(45) Date of Patent: May 5, 2026

(54) TWO-SIDED INTERCONNECTED EMBEDDED CHIP PACKAGING STRUCTURE AND MANUFACTURING METHOD THEREFOR

(71) Applicant: Zhuhai ACCESS Semiconductor Co., Ltd, Guangdong (CN)

(72) Inventors: Xianming Chen, Guangdong (CN); Jindong Feng, Guangdong (CN); Benxia Huang, Guangdong (CN); Yejie Hong, Guangdong (CN)

(73) Assignee: Zhuhai ACCESS Semiconductor Co., Ltd, Guangdong (CN)

( * ) Notice: Subject to any disclaimer, the term of this patent is extended or adjusted under 35 U.S.C. 154(b) by 853 days.

(21) Appl. No.: 17/957,138

(22) Filed: Sep. 30, 2022

(65) Prior Publication Data

US 2023/0154857 A1     May 18, 2023

(30) Foreign Application Priority Data

Nov. 18, 2021     (CN) .......................... 202111410151.0

(51) Int. Cl.
*H10W 70/60*          (2026.01)
*H10W 40/00*          (2026.01)
(Continued)

(52) U.S. Cl.
CPC ....... *H10W 70/614* (2026.01); *H10W 40/037* (2026.01); *H10W 40/228* (2026.01);
(Continued)

(58) Field of Classification Search
CPC ............. H01L 23/5389; H01L 21/4857; H01L 21/486; H01L 21/4882; H01L 23/3677;
(Continued)

(56) References Cited

U.S. PATENT DOCUMENTS 11,621,218 B1 *  4/2023  Tang ........................ H01L 21/56
                                                          257/737
2005/0122698 A1 *  6/2005  Ho ...................... H01L 23/5389
                                                          361/764

(Continued)

FOREIGN PATENT DOCUMENTS

CN          109686669 A      4/2019

*Primary Examiner* — Jacob Y Choi
*Assistant Examiner* — Neil R Prasad
(74) *Attorney, Agent, or Firm* — The PL Law Group, PLLC

(57)          ABSTRACT

A two-sided interconnected embedded chip packaging structure includes a first insulating layer and a second insulating layer. The first insulating layer includes a first conductive copper column layer penetrating through the first insulating layer in a height direction and a first chip located between adjacent first conductive copper columns, and the first chip is attached to the inside of the lower surface of the first insulating layer. The second insulating layer includes a first conductive wire layer and a heat radiation copper surface which are located in the upper surface of the second insulating layer, the first conductive wire layer is provided with a second conductive copper column layer, the first conductive copper column layer is connected with the first conductive wire layer, and the heat radiation copper surface is connected with the reverse side of the first chip.

7 Claims, 11 Drawing Sheets

(51) Int. Cl.

| | |
|---|---|
| *H10W 40/22* | (2026.01) |
| *H10W 40/25* | (2026.01) |
| *H10W 70/05* | (2026.01) |
| *H10W 70/65* | (2026.01) |
| *H10W 70/685* | (2026.01) |
| *H10W 90/00* | (2026.01) |
| *H10W 72/00* | (2026.01) |
| *H10W 72/30* | (2026.01) |

(52) U.S. Cl.

CPC ......... *H10W 40/258* (2026.01); *H10W 70/05* (2026.01); *H10W 70/095* (2026.01); *H10W 70/611* (2026.01); *H10W 70/65* (2026.01); *H10W 70/685* (2026.01); *H10W 90/00* (2026.01); *H10W 72/30* (2026.01); *H10W 72/874* (2026.01)

(58) Field of Classification Search

CPC ........... H01L 23/3736; H01L 23/49822; H01L 23/49838; H01L 23/5383; H01L 23/5386; H01L 24/24; H01L 25/16; H01L 24/32; H01L 24/73; H01L 2224/24195; H01L 2224/73267

See application file for complete search history.

(56) References Cited

U.S. PATENT DOCUMENTS

| | | | | |
|---|---|---|---|---|
| 2006/0043606 A1* | 3/2006 | Imaoka | ................... | H01L 24/24 |
| | | | | 257/E25.011 |
| 2015/0371960 A1* | 12/2015 | Yap | ........................ | H01L 24/09 |
| | | | | 257/664 |

\* cited by examiner

TWO-SIDED INTERCONNECTED EMBEDDED CHIP PACKAGING STRUCTURE AND MANUFACTURING METHOD THEREFOR

CROSS REFERENCE TO RELATED APPLICATIONS AND CLAIM OF PRIORITY

The present application claims the benefit of Chinese Patent Application No. 202111410151.0 filed on Nov. 18, 2021 at the Chinese Intellectual Property Office, the disclosures of which are incorporated by reference herein in their entirety.

BACKGROUND

1. Technical Field

The present disclosure relates to a packaging structure of an electronic device, in particular to a two-sided interconnected embedded chip packaging (ECP) structure and a manufacturing method therefor.

2. Background of the Invention

In order to meet the development demand of an electronic technology, an electronic product tends to be miniaturized, thereby promoting the process of high-density integration of a semiconductor integrated circuit. How to reasonably package devices such as a plurality of chips to achieve high functionalization and miniaturization has become an important research subject in the current semiconductor packaging industry. Meanwhile, in view of cost and efficiency, panel-level packaging has also become the current tendency. In a process that a substrate is fabricated, devices such as chips are embedded into the substrate, by which the output efficiency is increased while the packaging volume is effectively reduced, and meanwhile, the cost is greatly reduced than that of wafer-level packaging. Through continuous development and evolution, a panel-level embedded packaging technology has been applied more and more and has played a more and more important role in the field of semiconductor packaging. In the meantime, the panel-level embedded packaging technology has been also developed. In the field of current panel-level embedded packaging, the embedded packaging for the devices such as the plurality of chips has been possible, but it still has certain limitations.

The embedded packaging for the devices such as the plurality of chips has been possible by using an existing panel-level embedded packaging solution such as a panel-level embedded packaging solution disclosed in the Chinese patent CN109686669A. As shown in FIG. 1, in the solution, firstly, an organic polymer frame 10 with a cavity is prefabricated by using a coreless copper column method; next, the plurality of devices 11 are embedded into the cavity of the polymer frame 10 at one time, and single-sided fanout is performed after packaging; and then, double-sided layer addition is performed.

The solution has certain limitations that before the embedded packaging for the devices is performed, the polymer frame with the cavity needs to be prefabricated, so that the processing process is long, and the cost is high; the plurality of devices which are subjected to the embedded packaging are required to be disposed on the same layer so as to be small in designed degree of freedom, and the devices which are greater in thickness difference may not be packaged at the same time; and after the embedded packaging for the plurality of devices is completed, only single-sided fanout may be achieved, and therefore, the wiring difficulty is high.

SUMMARY

Implementation solutions of the present disclosure provide a two-sided interconnected embedded chip packaging structure and a manufacturing method therefor to solve the above-mentioned technical problems. According to the present disclosure, devices such as chips are attached to a copper plate on which copper columns have been predisposed, then, first packaging is performed, and a process of fabricating a frame is omitted, so that the cost is reduced; after the first packaging is completed, layers are added, and a cavity is fabricated; and second packaging is performed, the devices such as the chips are embedded to be packaged in the cavity, and fanout is performed after packaging is completed. By in-batch embedded packaging, the purpose of packaging the devices on different layers is achieved to meet the embedded packaging of the devices greatly differing in thickness. Meanwhile, by in-batch embedded packaging, two-sided fanout and interconnection of a plurality of devices may be achieved.

A first aspect of the present disclosure relates to a manufacturing method for a two-sided interconnected embedded chip packaging structure, including the following steps:

(a) preparing a copper plate, and forming a first conductive copper column layer and a first loopback strip-shaped copper column layer on the surface of at least one side of the copper plate, wherein the first loopback strip-shaped copper column layer includes at least one loopback strip-shaped copper column;

(b) attaching a first chip to the surface of the copper plate, locating the first chip between adjacent first conductive copper columns of the first conductive copper column layer, and forming a first insulating layer on the surface of the copper plate to package the first conductive copper column layer, the first loopback strip-shaped copper column layer and the first chip;

(c) etching the copper plate to form a first wire layer, wherein the first wire layer includes a first conductive wire layer, a first sacrificial wire layer and a heat radiation copper surface, wherein the heat radiation copper surface is connected with the reverse side of the first chip, the first conductive copper column layer is connected with the first conductive wire layer, and the first loopback strip-shaped copper column layer is connected with the first sacrificial wire layer;

(d) forming a second insulating layer on the first wire layer, wherein the second insulating layer includes a second conductive copper column layer and a second loopback strip-shaped copper column layer which are located on the surface of the first wire layer, the second conductive copper column layer is connected with the first conductive wire layer, the second loopback strip-shaped copper column layer is connected with the first sacrificial wire layer, and the first loopback strip-shaped copper column layer longitudinally overlaps with the second loopback strip-shaped copper column layer;

(e) respectively thinning the first insulating layer and the second insulating layer to expose ends of the first conductive copper column layer and the first loopback strip-shaped copper column layer as well as ends of the second conductive copper column layer and the second loopback strip-shaped copper column layer;

(f) simultaneously etching the loopback strip-shaped copper columns, longitudinally located on the same position, of the first loopback strip-shaped copper column layer and the second loopback strip-shaped copper column layer as well as the first sacrificial wire layer, and removing an insulating material therein to form a device placing hole frame;

(g) attaching a second chip to the bottom or top of the device placing hole frame, and forming an insulated packaging layer in a gap between the second chip and the device placing hole frame; and (h) respectively forming a second wire layer and a third wire layer on surfaces of the first insulating layer and the second insulating layer, wherein the first conductive wire layer and the second wire layer are conducted and connected by the first conductive copper column layer, the first conductive wire layer and the third wire layer are conducted and connected by the second conductive copper column layer, and a terminal of the second chip communicates with the second wire layer or the third wire layer.

In some implementation solutions, the step (a) includes:

(a1) preparing a copper plate, applying a first photoresist layer to the surface of at least one side of the copper plate, and exposing and developing the first photoresist layer to form a first feature pattern;

(a2) electroplating copper in the first feature pattern to form a first conductive copper column layer and a first loopback strip-shaped copper column layer; and (a3) removing the first photoresist layer.

In some implementation solutions, the step (b) includes: pasting a bonding material to the surface of the copper plate, and attaching the reverse side of the first chip to the bonding material, so that the first chip is attached to the surface of the copper plate.

In some implementation solutions, the step (c) includes:

(c1) applying a second photoresist layer to the surface of the copper plate, and exposing and developing the second photoresist layer to form a second feature pattern;

(c2) etching the copper plate exposed in the second feature pattern to form a first wire layer; and (c3) removing the second photoresist layer.

In some implementation solutions, the step (d) includes:

(d1) forming a first metal seed layer on the surfaces of the first wire layer and the copper plate;

(d2) applying a third photoresist layer to the first metal seed layer, and exposing and developing the third photoresist layer to form a third feature pattern;

(d3) electroplating copper in the third feature pattern to form a second conductive copper column layer and a second loopback strip-shaped copper column layer;

(d4) removing the third photoresist layer, and etching the exposed first metal seed layer; and (d5) forming a second insulating layer covering the first wire layer, the second conductive copper column layer and the second loopback strip-shaped copper column layer.

In some implementation solutions, the step (e) includes: wholly thinning the first insulating layer and the second insulating layer respectively in a manner of plate grinding, plasma etching or sand blasting to expose ends of the first conductive copper column layer and the first loopback strip-shaped copper column layer as well as ends of the second conductive copper column layer and the second loopback strip-shaped copper column layer.

In some implementation solutions, the step (e) includes: partially thinning the first insulating layer and the second insulating layer respectively in a manner of laser, mechanical drilling or photoetching to expose ends of the first conductive copper column layer and the first loopback strip-shaped copper column layer as well as ends of the second conductive copper column layer and the second loopback strip-shaped copper column layer.

In some implementation solutions, the step (f) includes:

(f1) respectively applying a fourth photoresist layer and a fifth photoresist layer to the surfaces of the first insulating layer and the second insulating layer, and exposing and developing the fourth photoresist layer and the fifth photoresist layer to respectively form a fourth feature pattern and a fifth feature pattern;

(f2) respectively etching the loopback strip-shaped copper columns, longitudinally located on the same position, of the first loopback strip-shaped copper column layer and the second loopback strip-shaped copper column layer as well as the first sacrificial wire layer in the fourth feature pattern and the fifth feature pattern, and removing an insulating material therein to form a device placing hole frame; and (f3) respectively removing the fourth photoresist layer and the fifth photoresist layer.

In some implementation solutions, the step (g) includes:

(g1) disposing a first bonding layer on the surface of the first insulating layer;

(g2) placing the second chip into the device placing hole frame, wherein a terminal surface of the second chip is attached to the first bonding layer;

(g3) forming an insulated packaging layer in a gap between the second chip and the device placing hole frame and on the surface of the second insulating layer;

(g4) thinning the insulated packaging layer to expose the end of the second conductive copper column layer; and (g5) removing the first bonding layer.

In some implementation solutions, the step (h) includes:

(h1) disposing a second bonding layer on the surface of the second insulating layer;

(h2) partially thinning the first insulating layer to form an open window so as to expose a terminal of the first chip;

(h3) removing the second bonding layer;

(h4) forming a second metal seed layer on the surface of the first insulating layer as well as the bottom and side wall of the open window, and forming a third metal seed layer on the surface of the second insulating layer;

(h5) respectively applying a sixth photoresist layer and a seventh photoresist layer to the surfaces of the second metal seed layer and the third metal seed layer, and exposing and developing the sixth photoresist layer and the seventh photoresist layer to respectively form a sixth feature pattern and a seventh feature pattern;

(h6) respectively electroplating copper in the sixth feature pattern and the seventh feature pattern to form a second wire layer and a third wire layer; and (h7) removing the sixth photoresist layer and the seventh photoresist layer, and etching the second metal seed layer and the third metal seed layer which are exposed.

In some implementation solutions, the step (g) includes:

(g1') disposing a first bonding layer on the surface of the second insulating layer;

(g2') placing the second chip into the device placing hole frame, wherein the terminal surface of the second chip is attached to the first bonding layer;

(g3') forming an insulated packaging layer in a gap between the second chip and the device placing hole frame and on the surface of the first insulating layer; and (g4') thinning the insulated packaging layer to expose the end of the first conductive copper column layer.

In some implementation solutions, the step (h) includes:

(h1') partially thinning the first insulating layer to form an open window so as to expose the terminal of the first chip;

(h2') removing the first bonding layer;

(h3') forming a second metal seed layer on the surface of the first insulating layer as well as the bottom and side wall of the open window, and forming a third metal seed layer on the surface of the second insulating layer;

(h4') respectively applying a sixth photoresist layer and a seventh photoresist layer to the surfaces of the second metal seed layer and the third metal seed layer, and exposing and developing the sixth photoresist layer and the seventh photoresist layer to respectively form a sixth feature pattern and a seventh feature pattern;

(h5') respectively electroplating copper in the sixth feature pattern and the seventh feature pattern to form a second wire layer and a third wire layer; and (h6') removing the sixth photoresist layer and the seventh photoresist layer, and etching the second metal seed layer and the third metal seed layer which are exposed.

In some implementation solutions, the manufacturing method includes: partially thinning the first insulating layer in a manner of laser, mechanical drilling or photoetching to form an open window so as to expose the terminal of the first chip.

In some implementation solutions, the manufacturing method includes: preparing the metal seed layers in a manner of chemical plating or sputtering. Preferably, the metal seed layers are prepared in a manner of chemical plating.

In some implementation solutions, the metal seed layers include titanium, copper, a titanium-tungsten alloy or combinations thereof.

In some implementation solutions, the manufacturing method further includes:

(i) after the step h is completed, respectively forming a first solder mask and a second solder mask on the second wire layer and the third wire layer, and performing surface treatment on exposed metal to respectively form a first metal surface treatment layer and a second metal surface treatment layer.

In some implementation solutions, the manufacturing method includes: performing surface treatment on the exposed metal by antioxidation, nickel-palladium-gold deposition, tin plating or silver deposition.

A second aspect of the present disclosure provides a two-sided interconnected embedded chip packaging structure, including a first insulating layer and a second insulating layer, the first insulating layer including a first conductive copper column layer penetrating through the first insulating layer in a height direction and a first chip located between adjacent first conductive copper columns, the first chip being attached to the inside of the lower surface of the first insulating layer, the second insulating layer including a first conductive wire layer and a heat radiation copper surface which are located in the upper surface of the second insulating layer, the first conductive wire layer being provided with a second conductive copper column layer, the first conductive copper column layer being connected with the first conductive wire layer, and the heat radiation copper surface being connected with the reverse side of the first chip; further including a device placing hole frame penetrating through the first insulating layer and the second insulating layer, wherein a second chip is attached to the bottom of the device placing hole frame, an insulated packaging layer is formed in a gap between the second chip and the device placing hole frame, and the first chip and the second chip differ in thickness.

In some implementation solutions, the second chip is a passive device.

In some implementation solutions, a second wire layer and a third wire layer are respectively disposed on the first insulating layer and the second insulating layer, a terminal of the first chip is connected with the second wire layer, a terminal of the second chip is connected with the second wire layer or the third wire layer, the first conductive wire layer and the second wire layer are conducted and connected by the first conductive copper column layer, and the first conductive wire layer and the third wire layer are conducted and connected by the second conductive copper column layer.

In some implementation solutions, the two-sided interconnected embedded chip packaging structure further includes a first solder mask and a second solder mask respectively formed on the second wire layer and the third wire layer, a first metal surface treatment layer is disposed in the first solder mask, and a second metal surface treatment layer is disposed in the second solder mask.

In some implementation solutions, each of the first chip and the second chip includes at least one chip.

In some implementation solutions, the first insulating layer and the second insulating layer include the same or different insulating materials.

In some implementation solutions, each of the first insulating layer and the second insulating layer includes polyimide, epoxy resin, bismaleimide/triazine resin, polyphenyl ether, polyacrylate, prepreg, membrane-like organic resin or combinations thereof.

In some implementation solutions, an end of the first conductive copper column layer is flush with or higher than the first insulating layer, and an end of the second conductive copper column layer is flush with or higher than the second insulating layer.

In some implementation solutions, each of the first conductive copper column layer and the second conductive copper column layer includes at least one copper through hole column.

In some implementation solutions, each of the first conductive copper column layer and the second conductive copper column layer includes at least one copper through hole column with the same or different sectional sizes and/or shapes.

BRIEF DESCRIPTION OF THE DRAWINGS

In order to better understand the implementations of the present disclosure provided by the present disclosure, the following description refers to the accompanying drawings in a manner of pure illustration.

When specific reference is made to the accompanying drawings, it must be emphasized that specific illustration is exemplary, is only for the purpose of illustratively discussing preferred implementation solutions of the present disclosure, and is presented based on the reason of providing the illustration which is regarded to be most useful and understandable for describing the principle and concept of the present disclosure. Therefore, the inventor does not try to illustrate structural details of the present disclosure by exceeding the detail level necessary for basically understanding the present disclosure; and with reference to the accompanying drawings, the skill in the art realizes how to actually embody several forms of the present disclosure. In the accompanying drawings.

DETAILED DESCRIPTION OF THE EMBODIMENTS

Figures 1, 2:
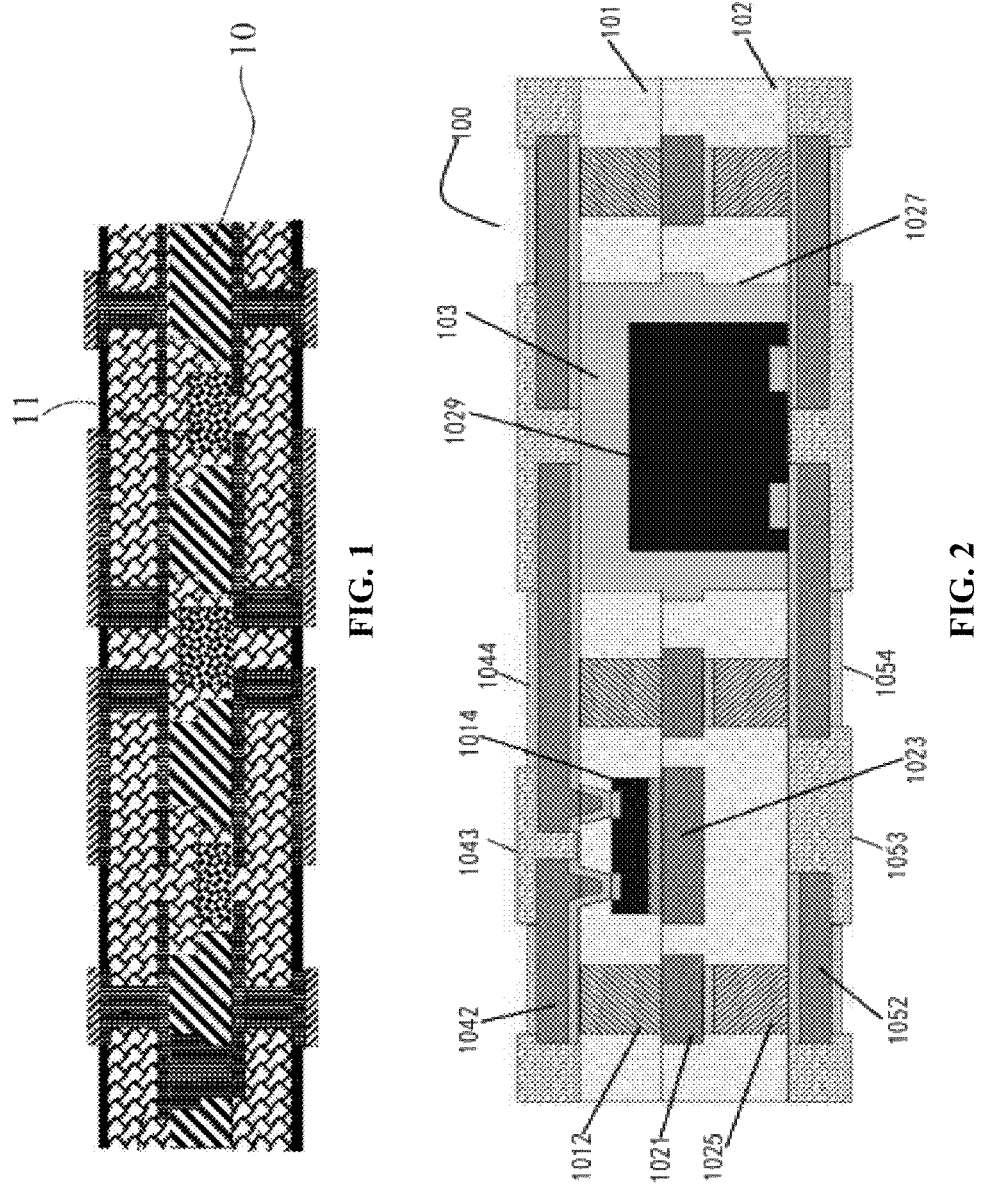
FIG. 1 is a schematic view showing an integrated circuit packaging method and a section of a packaging structure in the prior art.
FIG. 2 is a schematic view showing a section of a double-sided interconnected embedded chip packaging structure according to one implementation solution of the present disclosure.

With reference to FIG. 2, a schematic view showing a section of a double-sided interconnected embedded chip packaging structure 100 is shown. The double-sided interconnected embedded chip packaging structure 100 includes a first insulating layer 101 and a second insulating layer 102, the first insulating layer 101 and the second insulating layer 102 may include the same insulating material or different insulating materials and may include polyimide, epoxy resin, bismaleimide/triazine resin, polyphenyl ether, polyacrylate, prepreg, membrane-like organic resin or combinations thereof.

The first insulating layer 101 includes a first conductive copper column layer 1012 penetrating through the first insulating layer 101 in a height direction and a first chip 1014 located between adjacent first conductive copper columns; the first chip 1014 may include at least one chip; the first chip 1014 is attached to the inside of the lower surface of the first insulating layer 101; and preferably, the first chip 1014 is pasted to the inside of the lower surface of the first insulating layer 101 by a bonding material. An end of the first conductive copper column layer 1012 may be flush with or higher than the first insulating layer 101; the first conductive copper column layer 1012 may include at least one copper through hole column of which the section may be circular or square which is determined as required; and preferably, the first conductive copper column layer 1012 is provided with a plurality of copper through hole columns serving as transfer IO channels and having the same or different sectional sizes and/or shapes.

The second insulating layer 102 includes a first conductive wire layer 1021 and a heat radiation copper surface 1023 which are located in the upper surface of the second insulating layer 102, the first conductive wire layer 1021 is provided with a second conductive copper column layer 1025, the first conductive copper column layer 1012 is connected with the first conductive wire layer 1021, and the heat radiation copper surface 1023 is connected with the reverse side of the first chip 1014. An end of the second conductive copper column layer 1025 may be flush with or higher than the second insulating layer 102; the second conductive copper column layer 1025 may include at least one copper through hole column of which the section may be circular or square which is determined as required; and preferably, the second conductive copper column layer 1025 is provided with a plurality of copper through hole columns serving as transfer IO channels and having the same or different sectional sizes and/or shapes.

The double-sided interconnected embedded chip packaging structure 100 further includes a device placing hole frame 1027 penetrating through the first insulating layer 101 and the second insulating layer 102, wherein a second chip 1029 is attached to the bottom of the device placing hole frame 1027, and the second chip 1029 may include at least one chip and may also be a passive device; and an insulated packaging layer is formed in a gap between the second chip 1029 and the device placing hole frame 1027 to package the second chip 1029; and the first chip 1014 and the second chip 1029 differ in thickness.

A second wire layer 1042 and a third wire layer 1052 are respectively disposed on the first insulating layer 101 and the second insulating layer 102, a terminal of the first chip 1014 is connected with the second wire layer 1042, a terminal of the second chip 1029 is connected with the third wire layer 1052, the first conductive wire layer 1021 and the second wire layer 1042 are conducted and connected by the first conductive copper column layer 1012, and the first conductive wire layer 1021 and the third wire layer 1052 are conducted and connected by the second conductive copper column layer 1025. By embedded packaging for the first chip 1014 and the second chip 1029 having the different thicknesses in the different insulating layers, the embedded packaging for a plurality of chips greatly differing in thickness is achieved, and it is convenient to achieve the two-sided fanout and interconnection of all the chips.

The double-sided interconnected embedded chip packaging structure 100 further includes a first solder mask 1043 and a second solder mask 1053 respectively formed on the second wire layer 1042 and the third wire layer 1052, a first metal surface treatment layer 1044 is disposed in the first solder mask 1043, and a second metal surface treatment layer 1054 is disposed in the second solder mask 1053.

Figures 3, 4A:
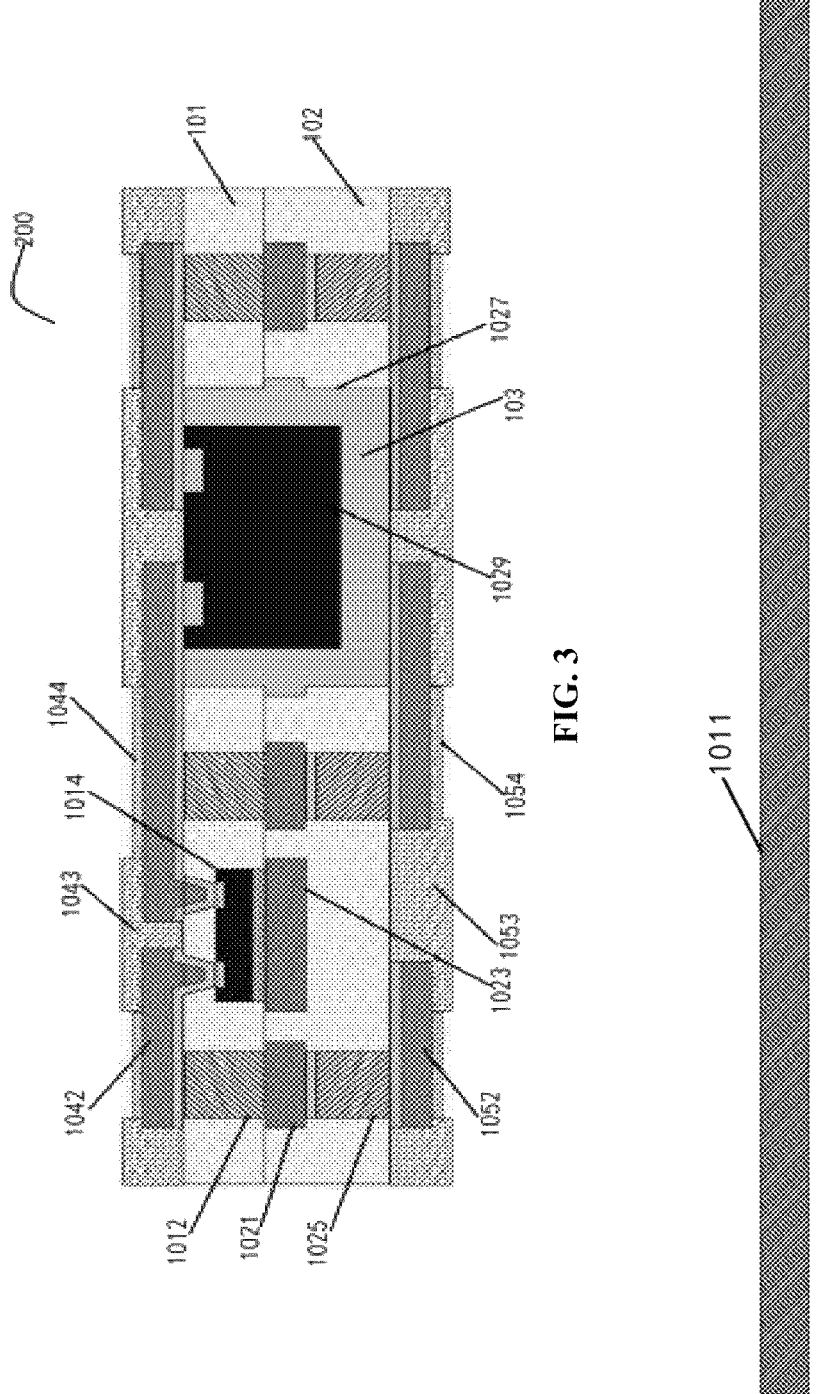
FIG. 3 is a schematic view showing a section of a double-sided interconnected embedded chip packaging structure according to another implementation solution of the present disclosure.
FIG. 4A to FIG. 4Q are schematic views showing a section of an intermediate structure in each step of a manufacturing method for a double-sided interconnected embedded chip packaging structure according to an implementation solution of the present disclosure.

With reference to FIG. 3, a double-sided interconnected embedded chip packaging structure 200 is the same as the double-sided interconnected embedded chip packaging structure 100, except that the terminal of the second chip 1029 is connected with the second wire layer 1042.

Figure 4B:
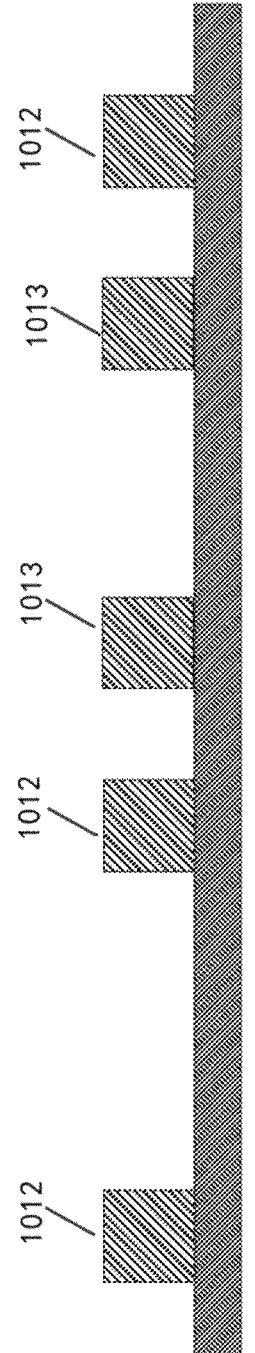
Figure 4B:
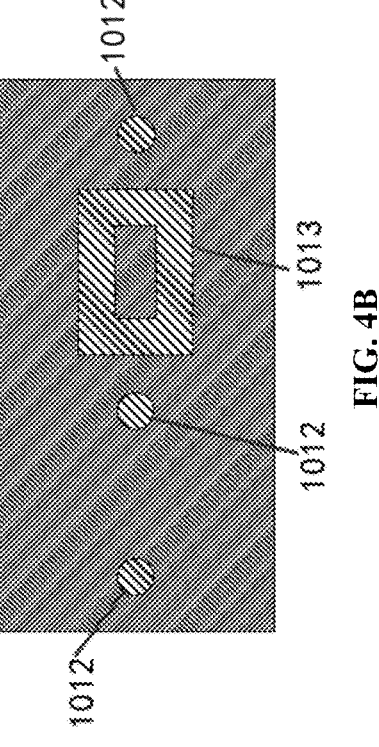
Figures 4C, 4D:
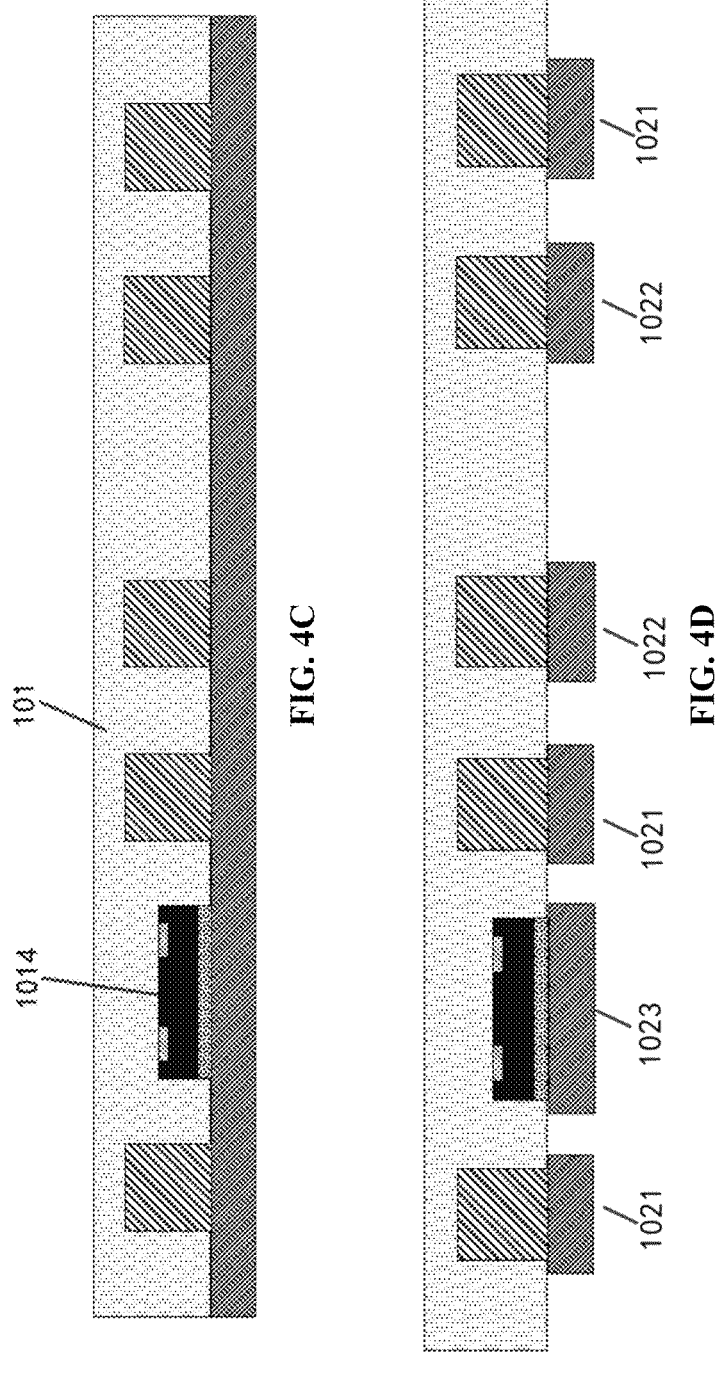
Figures 4E, 4F:
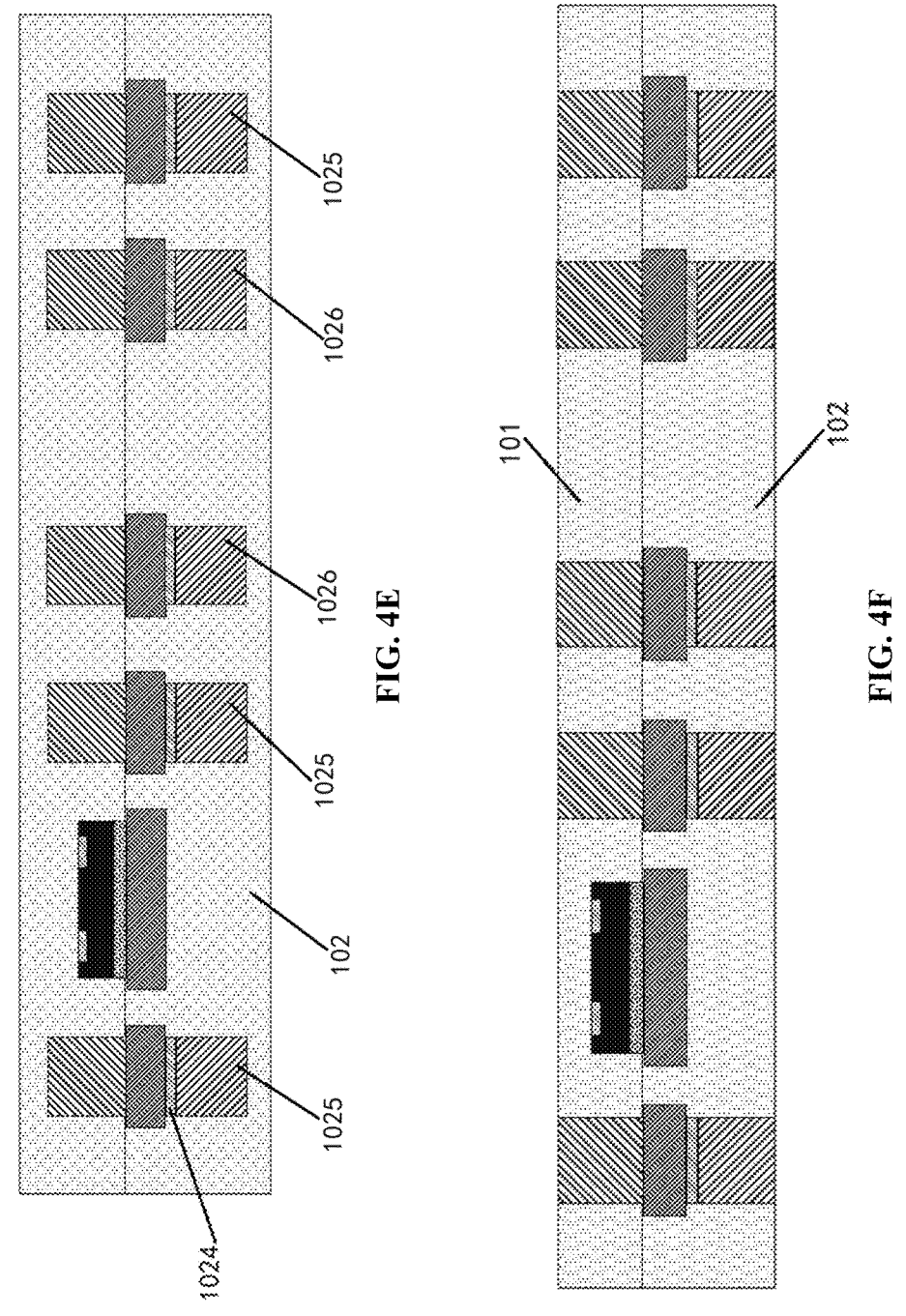
Figures 4G, 4H:
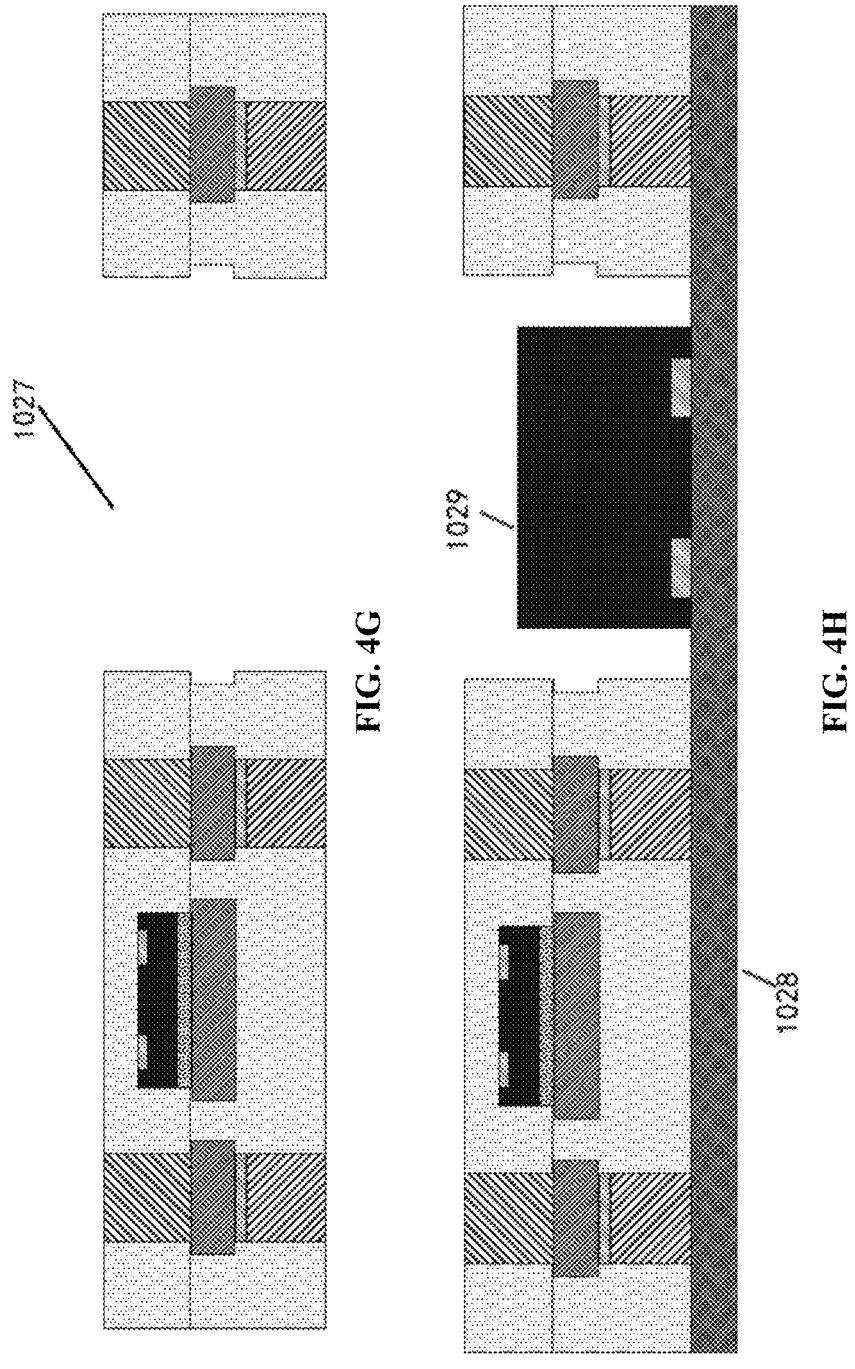
Figures 4I, 4J:
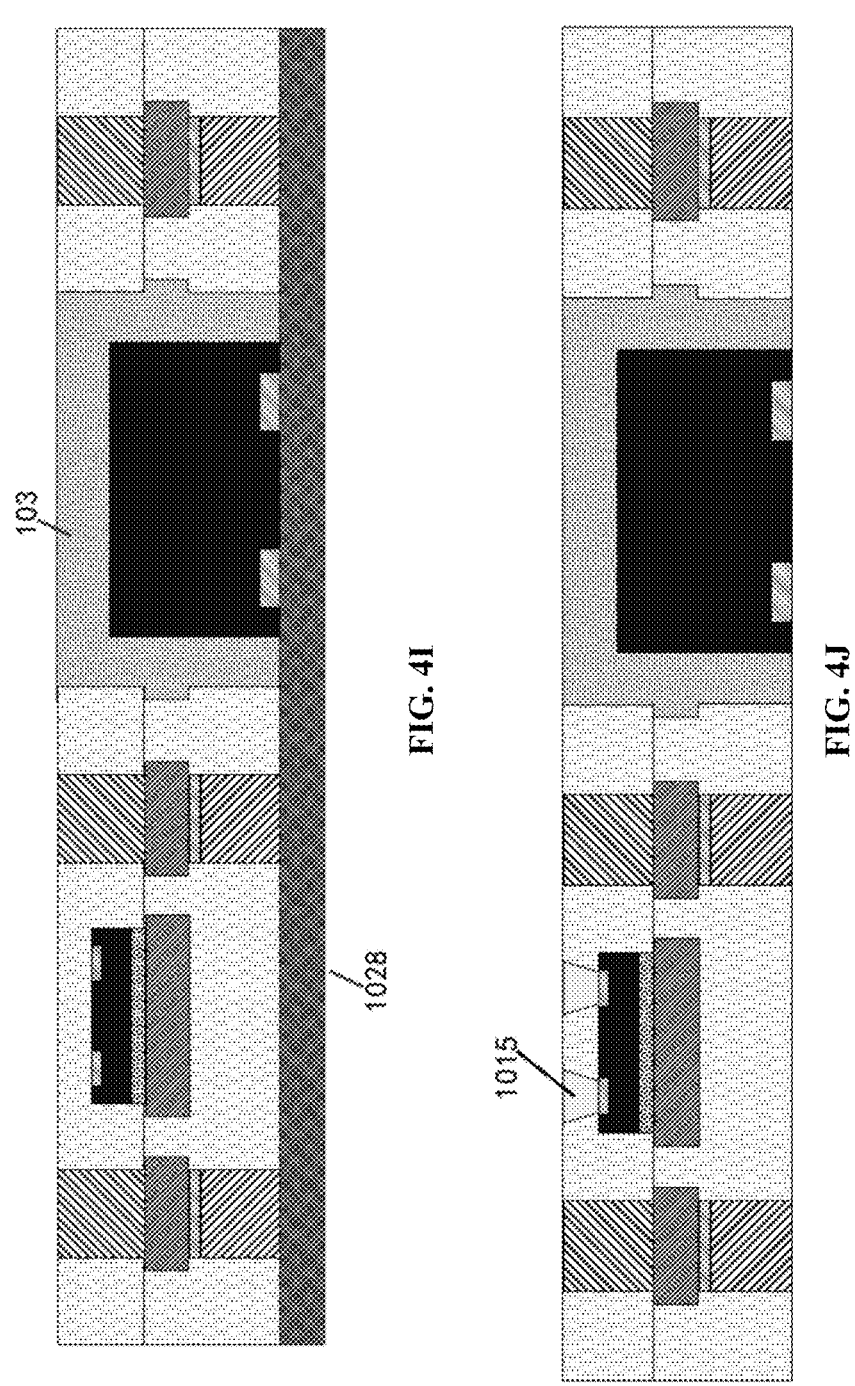
Figures 4K, 4L:
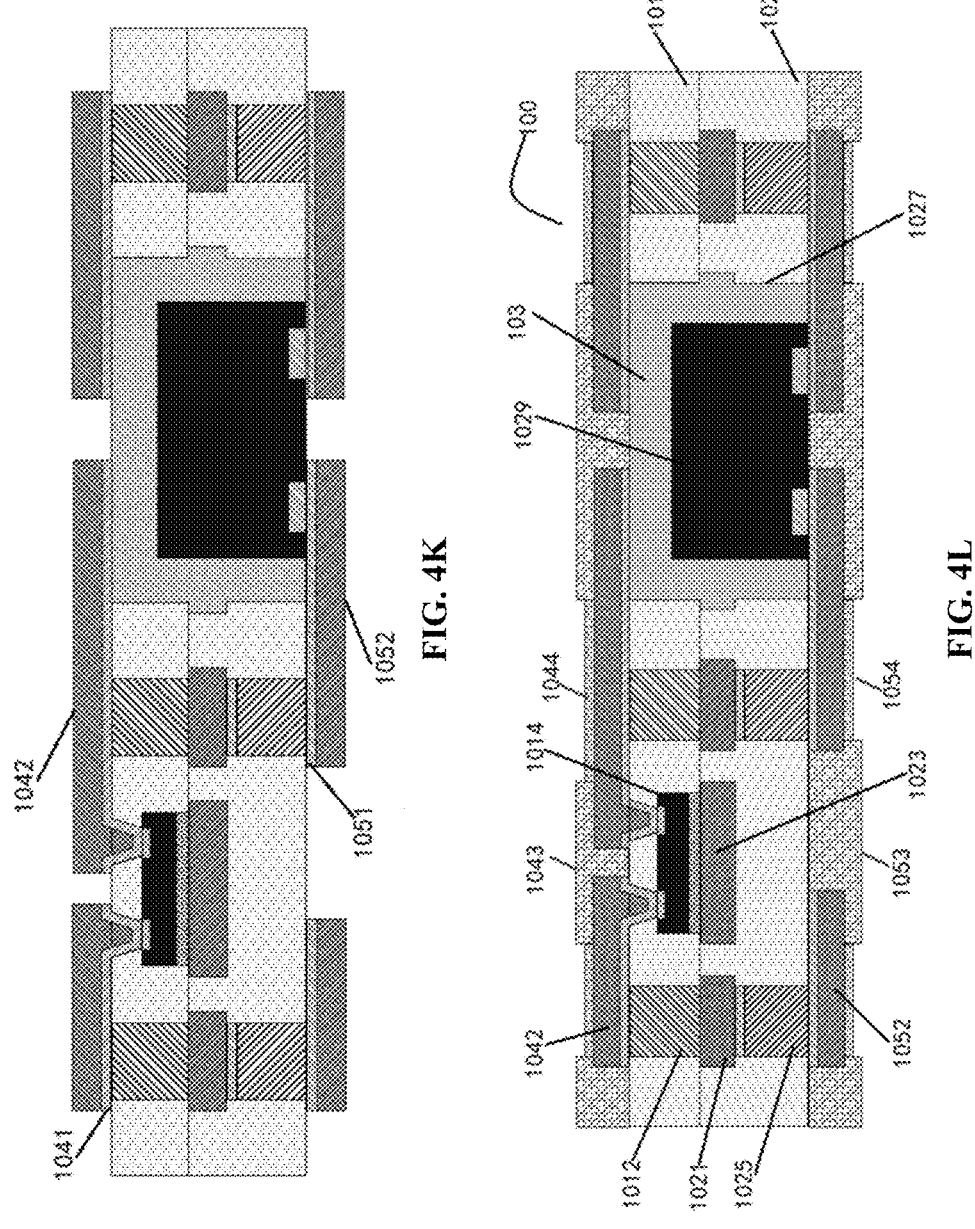
Figures 4M, 4N:
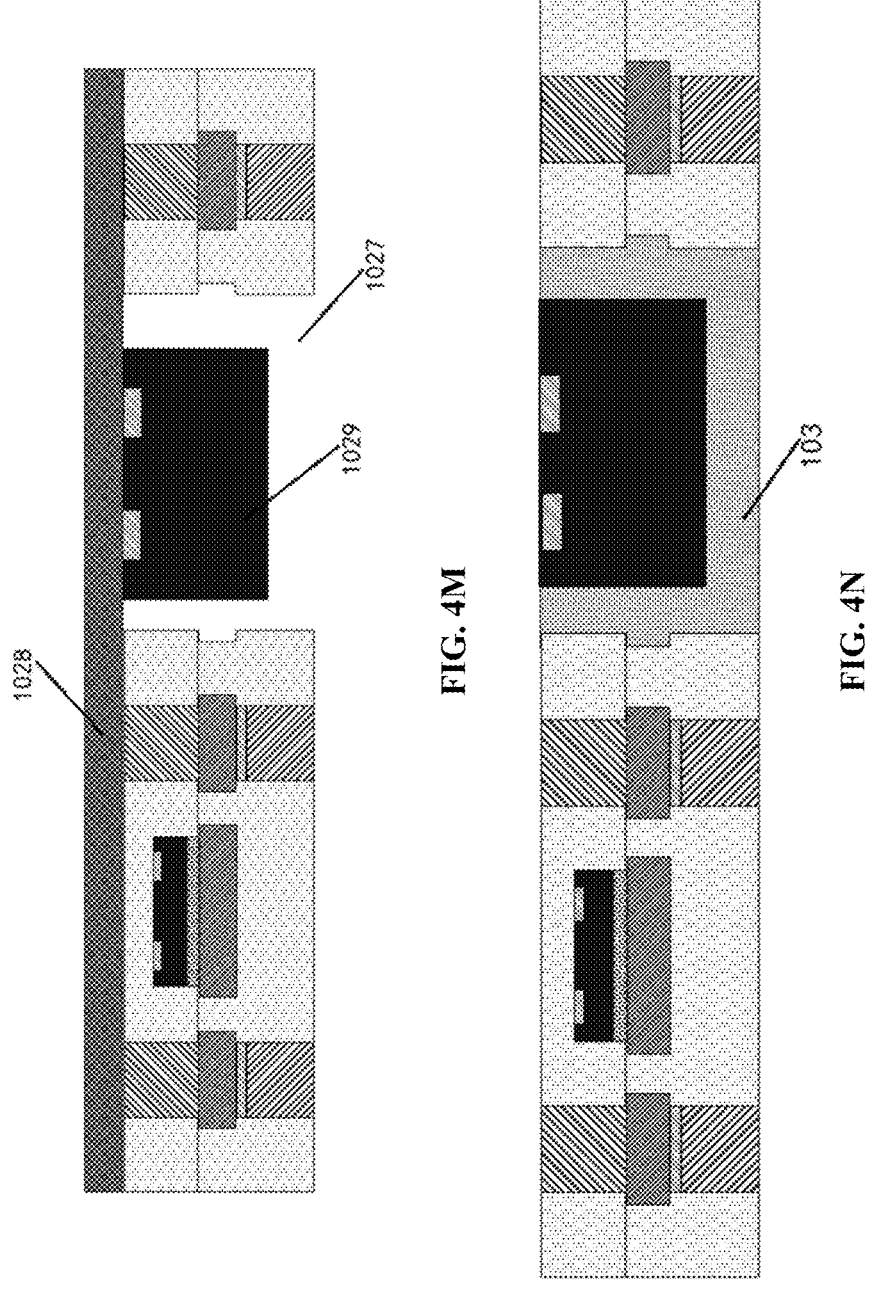
Figures 4O, 4P:
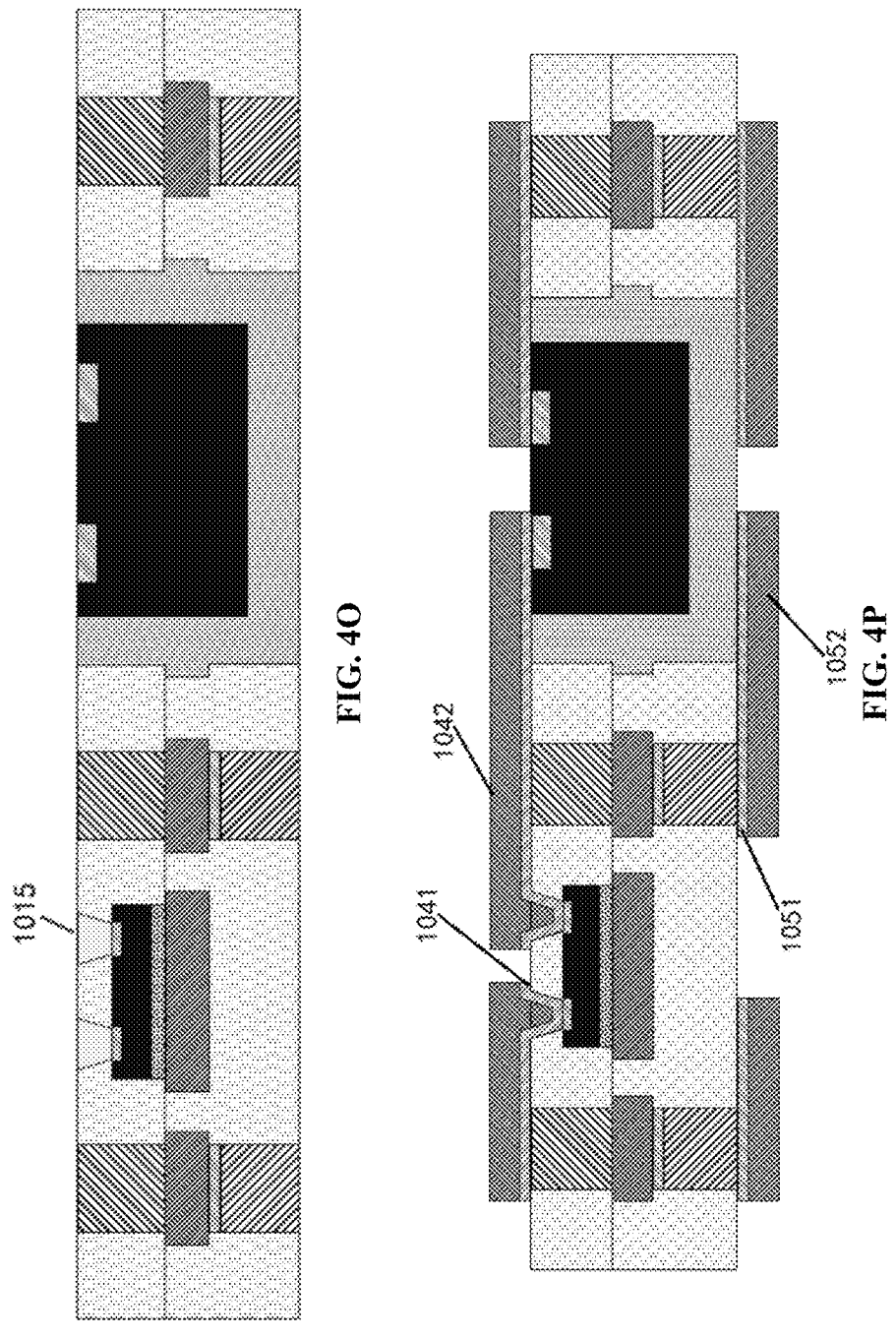
Figure 4Q:
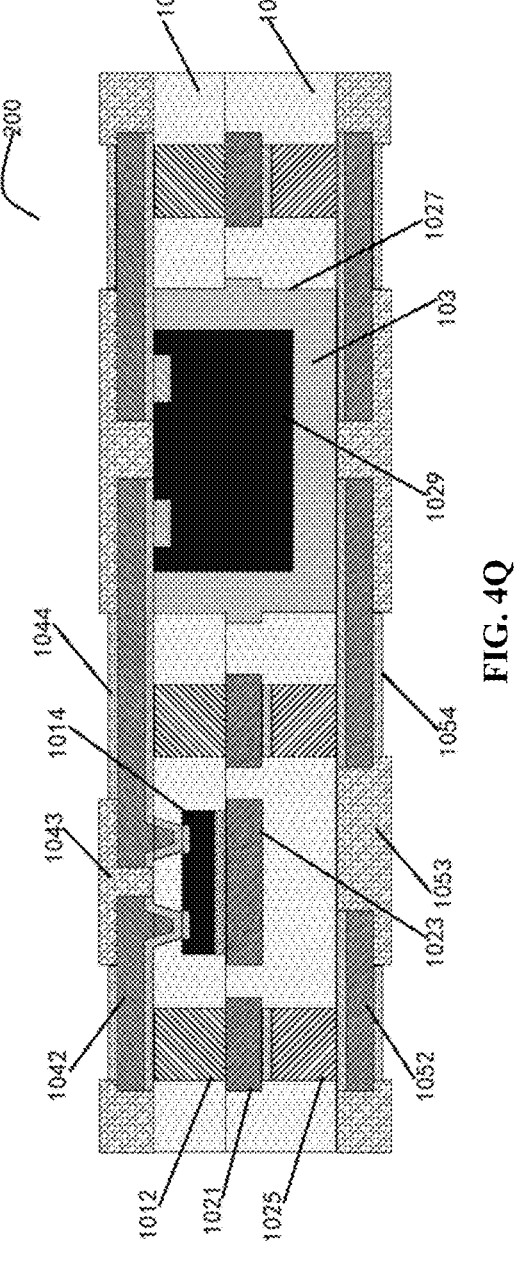

With reference to FIG. 4A to FIG. 4Q, schematic views showing a section of an intermediate structure in each step of a manufacturing method for a double-sided interconnected embedded chip packaging structure according to an implementation solution of the present disclosure are shown.

The manufacturing method includes the following steps: a copper plate 1011 is prepared, which is step (a), as shown in FIG. 4A. The thickness of the copper plate 1011 may be determined according to an actual demand. For example, the thickness of the copper plate 1011 may be determined according to support and operation requirement.

Then, step (b): a first photoresist layer is applied to the surface of at least one side of the copper plate 1011, the first photoresist layer is exposed and developed to form a first feature pattern, copper is electroplated in the first feature pattern to form a first conductive copper column layer 1012 and a first loopback strip-shaped copper column layer 1013, and then, the first photoresist layer is removed, as shown in FIG. 4B. Generally, a conductive copper column layer and a loopback strip-shaped copper column layer may be prepared on the surface of one side of the copper plate 1011, or conductive copper column layers and loopback strip-shaped copper column layers may be prepared on the surfaces of two sides of the copper plate 1011. In the present implementation solution, the subsequent demonstration is only for the situation that the conductive copper column layer and the loopback strip-shaped copper column layer are prepared on the surface of one side of the copper plate 1011, but the subsequent operation is not limited to that when the conductive copper column layer and the loopback strip-shaped copper column layer are prepared on the surface of one side of the copper plate 1011.

A top view of the first conductive copper column layer 1012 and the first loopback strip-shaped copper column layer 1013 are shown as FIG. 4B. Generally, the first conductive copper column layer 1012 may be provided with a plurality of copper through hole columns serving as transfer IO channels and having the same or different sectional sizes and shapes. The first loopback strip-shaped copper column layer 1013 includes at least one loopback strip-shaped copper column, and the first loopback strip-shaped copper column layer 1013 may be provided with a plurality of loopback strip-shaped copper columns for subsequently preparing the device placing hole frame, which is determined according to the number of chips required to be embedded, and the sizes of the loopback strip-shaped copper columns may be the same or different. In the present implementation solution, the subsequent demonstration is only for the situation that one loopback strip-shaped copper column is included, but the subsequent operation is not limited to that when the loopback strip-shaped copper column layer includes one loopback strip-shaped copper column.

Next, a first chip 1014 is attached to the surface of the copper plate 1011, the first chip 1014 is located between adjacent first conductive copper columns of the first conductive copper column layer 1012, and a first insulating layer 101 is formed on the surface of the copper plate 1011 to package the first conductive copper column layer 1012, the first loopback strip-shaped copper column layer 1013 and the first chip 1014, which is step (c), as shown in FIG. 4C. Generally, firstly, a bonding material is pasted to the surface of the copper plate 1011, and then, the reverse side of the first chip 1014 is attached to the bonding material, so that the first chip 1014 is attached to the surface of the copper plate 1011. The first chip 1014 may include at least one chip, and the number of the first chip 1014 may be determined according to an actual demand. The first insulating layer 101 may be formed on the surface of the copper plate 1011 in a manner of press-fitting an insulating material on the surface of the copper plate 1011, and the first insulating layer 101 may include polyimide, epoxy resin, bismaleimide/triazine resin, polyphenyl ether, polyacrylate, prepreg, membrane-like organic resin or combinations thereof.

Then, a second photoresist layer is applied to the surface of the copper plate 1011, the second photoresist layer is exposed and developed to form a second feature pattern, the copper plate 1011 exposed in the second feature pattern is etched to form a first wire layer, and the second photoresist layer is removed, which is step (d), as shown in FIG. 4D. The first wire layer includes a first conductive wire layer 1021, a first sacrificial wire layer 1022 and a heat radiation copper surface 1023, wherein the heat radiation copper surface 1023 is connected with the reverse side of the first chip 1014 to accelerate heat radiation of the first chip 1014, the first conductive copper column layer 1012 is connected with the first conductive wire layer 1021, and the first loopback strip-shaped copper column layer 1013 is connected with the first sacrificial wire layer 1022.

Next, a first metal seed layer 1024 is formed on the surfaces of the first wire layer and the copper plate 1011, a third photoresist layer is applied to the first metal seed layer 1024, and the third photoresist layer is exposed and developed to form a third feature pattern, copper is electroplated in the third feature pattern to form a second conductive copper column layer 1025 and a second loopback strip-shaped copper column layer 1026, the third photoresist layer is removed, the exposed first metal seed layer is etched, and then, a second insulating layer 102 covering the first wire layer, the second conductive copper column layer 1025 and the second loopback strip-shaped copper column layer 1026 is formed, which is step (e), as shown in FIG. 4E.

Generally, the first metal seed layer 1024 is prepared in a manner of chemical plating or sputtering, and the first metal seed layer 1024 may include titanium, copper, a titanium-tungsten alloy or combinations thereof. Preferably, the first metal seed layer 1024 is prepared in a manner of sputtering titanium and copper.

The second conductive copper column layer 1025 may be provided with a plurality of copper through hole columns serving as transfer IO channels and having the same or different sectional sizes and shapes; and the second conductive copper column layer 1025 is connected with the first conductive wire layer 1021. The second loopback strip-shaped copper column layer 1026 includes at least one loopback strip-shaped copper column, and the second loopback strip-shaped copper column layer 1026 may be provided with a plurality of loopback strip-shaped copper columns for subsequently preparing the device placing hole frame, which is determined according to the number of chips required to be embedded, and the sizes of the loopback strip-shaped copper columns may be the same or different. In the present implementation solution, the subsequent demonstration is only for the situation that one loopback strip-shaped copper column is included, but the subsequent operation is not limited to that when the loopback strip-shaped copper column layer includes one loopback strip-shaped copper column. The second loopback strip-shaped copper column layer 1026 is connected with the first sacrificial wire layer 1022, and the first loopback strip-shaped copper column layer 1013 longitudinally overlaps with the second loopback strip-shaped copper column layer 1026, which is beneficial to the formation of the device placing hole frame penetrating through a plurality of insulating layers in subsequent processes.

The second insulating layer 102 may be formed in a manner of press-fitting an insulating material on surfaces of the first wire layer, the second conductive copper column layer 1025 and the second loopback strip-shaped copper column layer 1026, and the second insulating layer 102 may include polyimide, epoxy resin, bismaleimide/triazine resin, polyphenyl ether, polyacrylate, prepreg, membrane-like organic resin or combinations thereof.

Then, the first insulating layer 101 and the second insulating layer 102 are respectively thinned to expose ends of the first conductive copper column layer 1012 and the first loopback strip-shaped copper column layer 1013 as well as ends of the second conductive copper column layer 1025 and the second loopback strip-shaped copper column layer 1026, which is step (0, as shown in FIG. 4F. Generally, it is possible to wholly thin the first insulating layer 101 and the second insulating layer 102 respectively in a manner of plate grinding, plasma etching or sand blasting to expose ends of the first conductive copper column layer 1012 and the first loopback strip-shaped copper column layer 1013 as well as ends of the second conductive copper column layer 1025 and the second loopback strip-shaped copper column layer 1026. It is also possible to partially thin the first insulating layer 101 and the second insulating layer 102 respectively in a manner of laser, mechanical drilling or photoetching to expose ends of the first conductive copper column layer 1012 and the first loopback strip-shaped copper column layer 1013 as well as ends of the second conductive copper column layer 1025 and the second loopback strip-shaped copper column layer 1026. Preferably, the first insulating layer 101 and the second insulating layer 102 are wholly thinned respectively in the manner of plate grinding, plasma etching or sand blasting to expose ends of the first conductive copper column layer 1012 and the first loopback strip-shaped copper column layer 1013 as well as ends of the second conductive copper column layer 1025 and the second loopback strip-shaped copper column layer 1026.

Next, a fourth photoresist layer and a fifth photoresist layer are respectively applied to the surfaces of the first insulating layer 101 and the second insulating layer 102, and the fourth photoresist layer and the fifth photoresist layer are exposed and developed to respectively form a fourth feature pattern and a fifth feature pattern, the loopback strip-shaped copper columns, longitudinally located on the same position, of the first loopback strip-shaped copper column layer 1013 and the second loopback strip-shaped copper column layer 1026 as well as the first sacrificial wire layer 1022 are respectively etched in the fourth feature pattern and the fifth feature pattern, an insulating material therein is removed to form a device placing hole frame 1027, and the fourth photoresist layer and the fifth photoresist layer are respectively removed, which is step (g), as shown in FIG. 4G. The fourth feature pattern and the fifth feature pattern are formed to expose the first loopback strip-shaped copper column layer 1013 and the second loopback strip-shaped copper column layer 1026 and shield the first conductive copper column layer 1012 and the second conductive copper column layer 1025, so that the phenomenon that the conductive copper column layers are affected when the loopback strip-shaped copper columns are etched is prevented. Generally, the number of the device placing hole frame may be determined according to an actual demand. In the present implementation solution, the subsequent demonstration is only for the situation that one device placing hole frame is included, but the subsequent operation is not limited to that when the structure includes one device placing hole frame.

After the step (g), a first bonding layer 1028 is disposed on the surface of the first insulating layer 101, the second chip 1029 is placed into the device placing hole frame 1027, wherein a terminal surface of the second chip 1029 is attached to the first bonding layer 1028, which is step (h), as shown in FIG. 4H. Generally, the first bonding layer 1028 may be an adhesive tape, and generally, the adhesive tape is a transparent film which is sold in the market and may be thermally decomposed or decomposed under ultraviolet irradiation. The second chip 1029 is placed into the device placing hole frame 1027, and the terminal surface of the second chip 1029 is attached to the exposed first bonding layer 1028 to support the second chip 1029 and perform temporary fixation. The second chip 1029 may include at least one chip, and the number of the second chip 1029 may be determined according to an actual demand. The second chip 1029 may be a passive device.

Next, an insulated packaging layer 103 is formed in a gap between the second chip 1029 and the device placing hole frame 1027 and on the surface of the first insulating layer

101, and the insulated packaging layer 103 is thinned to expose the end of the first conductive copper column layer 1012, which is step (i), as shown in FIG. 4I. Generally, the insulated packaging layer 103 may be formed in a manner of press-fitting an insulating material in the gap between the second chip 1029 and the device placing hole frame 1027, and the third insulating layer 103 may include polyimide, epoxy resin, bismaleimide/triazine resin, polyphenyl ether, polyacrylate, prepreg, membrane-like organic resin or combinations thereof.

Generally, the insulated packaging layer 103 may be wholly thinned in a manner of plate grinding, plasma etching or sand blasting to expose the end of the first conductive copper column layer 1012; or the insulated packaging layer 103 may be partially thinned in a manner of laser, mechanical drilling or photoetching to expose the end of the first conductive copper column layer 1012; and preferably, the insulated packaging layer 103 is wholly thinned in the manner of plate grinding, plasma etching or sand blasting.

Then, the first insulating layer 101 is partially thinned to form an open window 1015 so as to expose a terminal of the first chip 1014, and the first bonding layer 1028 is removed, which is step (j), as shown in FIG. 4J. Generally, the first insulating layer 101 may be partially thinned in a manner of laser, mechanical drilling or photoetching to form the open window 1015; and preferably, the first insulating layer 101 is partially thinned in a manner of laser to form the open window 1015. The first bonding layer 1028 may be removed in a manner of ultraviolet irradiation or thermal decomposition or a manner of direct tearing.

Next, a second metal seed layer 1041 is formed on the surface of the first insulating layer 101 as well as the bottom and side wall of the open window 1015, a third metal seed layer 1051 is formed on the surface of the second insulating layer 102, a sixth photoresist layer and a seventh photoresist layer are respectively applied to the surfaces of the second metal seed layer 1041 and the third metal seed layer 1051, the sixth photoresist layer and the seventh photoresist layer are exposed and developed to respectively form a sixth feature pattern and a seventh feature pattern, copper is respectively electroplated in the sixth feature pattern and the seventh feature pattern to form a second wire layer 1042 and a third wire layer 1052, the sixth photoresist layer and the seventh photoresist layer are removed, and the second metal seed layer 1041 and the third metal seed layer 1051 which are exposed are etched, which is step (k), as shown in FIG. 4K. Generally, the second metal seed layer 1041 and the third metal seed layer 1051 may be respectively prepared in a manner of chemical plating or sputtering, each of the second metal seed layer 1041 and the third metal seed layer 1051 may include titanium, copper, a titanium-tungsten alloy or combinations thereof. Preferably, the second metal seed layer 1041 and the third metal seed layer 1051 are respectively fabricated by sputtering titanium and copper.

Finally, a first solder mask 1043 and a second solder mask 1053 are respectively formed on the second wire layer 1042 and the third wire layer 1052, and surface treatment is performed on exposed metal to respectively form a first metal surface treatment layer 1044 and a second metal surface treatment layer 1054, and thus, the structure 100 is obtained, which is step (l), as shown in FIG. 4L. Generally, surface treatment may be performed on the exposed metal by antioxidation, nickel-palladium-gold deposition, tin plating or silver deposition.

After the step (g) is completed, a first bonding layer 1028 is disposed on the surface of the first insulating layer 101, the second chip 1029 is placed into the device placing hole frame 1027, wherein a terminal surface of the second chip 1029 is attached to the first bonding layer 1028, which is step (m), as shown in FIG. 4M.

Next, an insulated packaging layer 103 is formed in a gap between the second chip 1029 and the device placing hole frame 1027 and on the surface of the second insulating layer 102, the insulated packaging layer 103 is thinned to expose the end of the second conductive copper column layer 1025, and the first bonding layer 1028 is removed, which is step (n), as shown in FIG. 4N.

Then, a second bonding layer is disposed on the surface of the second insulating layer 102, the first insulating layer 101 is partially thinned to form an open window 1015 so as to expose a terminal of the first chip 1014, and the second bonding layer is removed, which is step (o), as shown in FIG. 4O. Generally, the second bonding layer may be an adhesive tape, and generally, the adhesive tape is a transparent film which is sold in the market and may be thermally decomposed or decomposed under ultraviolet irradiation. The second bonding layer may be removed in a manner of ultraviolet irradiation or thermal decomposition or in a manner of direct wearing.

Next, a second metal seed layer 1041 is formed on the surface of the first insulating layer 101 as well as the bottom and side wall of the open window 1015, a third metal seed layer 1051 is formed on the surface of the second insulating layer 102, a sixth photoresist layer and a seventh photoresist layer are respectively applied to the surfaces of the second metal seed layer 1041 and the third metal seed layer 1051, the sixth photoresist layer and the seventh photoresist layer are exposed and developed to respectively form a sixth feature pattern and a seventh feature pattern, copper is respectively electroplated in the sixth feature pattern and the seventh feature pattern to form a second wire layer 1042 and a third wire layer 1052, the sixth photoresist layer and the seventh photoresist layer are removed, and the second metal seed layer 1041 and the third metal seed layer 1051 which are exposed are etched, which is step (p), as shown in FIG. 4P.

Finally, a first solder mask 1043 and a second solder mask 1053 are respectively formed on the second wire layer 1042 and the third wire layer 1052, and surface treatment is performed on exposed metal to respectively form a first metal surface treatment layer 1044 and a second metal surface treatment layer 1054, and thus, the structure 200 is obtained, which is step (q), as shown in FIG. 4Q. Generally, surface treatment may be performed on the exposed metal by antioxidation, nickel-palladium-gold deposition, tin plating or silver deposition.

It will be realized by the skill in the art that the present disclosure is not limited to the contents specifically illustrated and described in the context. Moreover, the scope of the present disclosure is limited by the appended claims and includes combinations and sub-combinations of all the technical features in the preceding text as well as variations and improvements thereof, and the skill in the art will foresee such combinations, variations and improvements after reading the foregoing description.

In the claims, terms "comprise" and variants thereof, such as "comprising" and "comprised", mean that the listed devices are comprised, but other devices are generally not excluded.

What is claimed is:

1. A two-sided interconnected embedded chip packaging structure, comprising:
a first insulating layer comprising a first conductive copper column layer penetrating through the first insulating layer in a height direction and a first chip located between adjacent first conductive copper columns, the first chip being attached to the inside of the lower surface of the first insulating layer; and
a second insulating layer comprising a first conductive wire layer and a heat radiation copper surface which are located in the upper surface of the second insulating layer, wherein the first insulating layer is laminated on the second insulating layer in a manner of contacting each other, the first conductive wire layer being provided with a second conductive copper column layer which penetrating through the second insulating layer, the first conductive copper column layer being connected with the first conductive wire layer, and the heat radiation copper surface being connected with the reverse side of the first chip; further comprising a device placing hole frame penetrating through the first insulating layer and the second insulating layer, wherein a second chip is attached to the bottom of the device placing hole frame, an insulated packaging layer is formed in a gap between the second chip and the device placing hole frame, and the first chip and the second chip differ in thickness;
wherein a second wire layer is disposed on the upper surface of the first insulating layer and a third wire layer is disposed on the lower surface of the second insulating layer, a terminal of the first chip is connected with the second wire layer, a terminal of the second chip is connected with the second wire layer or the third wire layer, the first conductive wire layer and the second wire layer are conducted and connected by the first conductive copper column layer, and the first conductive wire layer and the third wire layer are conducted and connected by the second conductive copper column layer.

2. The two-sided interconnected embedded chip packaging structure of claim 1, further comprising a first solder mask and a second solder mask respectively formed on the second wire layer and the third wire layer, a first metal surface treatment layer is disposed in the first solder mask, and a second metal surface treatment layer is disposed in the second solder mask.

3. The two-sided interconnected embedded chip packaging structure of claim 1, wherein each of the first chip and the second chip comprises at least one chip.

4. The two-sided interconnected embedded chip packaging structure of claim 1, wherein the first insulating layer and the second insulating layer comprise the same or different insulating materials.

5. The two-sided interconnected embedded chip packaging structure of claim 1, wherein an end of the first conductive copper column layer is flush with or higher than the first insulating layer, and an end of the second conductive copper column layer is flush with or higher than the second insulating layer.

6. The two-sided interconnected embedded chip packaging structure of claim 1, wherein each of the first conductive copper column layer and the second conductive copper column layer comprises at least one copper through hole column.

7. The two-sided interconnected embedded chip packaging structure of claim 6, wherein each of the first conductive copper column layer and the second conductive copper column layer comprises at least one copper through hole column with the same or different sectional sizes and/or shapes.

* * * * *